United States Patent
Cho et al.

(10) Patent No.: US 8,501,524 B2
(45) Date of Patent: Aug. 6, 2013

(54) METHOD OF MANUFACTURING THIN-FILM LIGHT-ABSORBING LAYER, AND METHOD OF MANUFACTURING THIN-FILM SOLAR CELL USING THE SAME

(75) Inventors: Jung-Min Cho, Busan (KR); Eun-Jin Bae, Daejeon (KR); Chang-Woo Ham, Daejeon (KR); Jeong-Dae Suh, Daejeon (KR); Myung-Ae Chung, Daejeon (KR); Ki-Bong Song, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 140 days.

(21) Appl. No.: 13/034,262

(22) Filed: Feb. 24, 2011

(65) Prior Publication Data

US 2011/0209763 A1    Sep. 1, 2011

(30) Foreign Application Priority Data

Feb. 26, 2010  (KR) .................. 10-2010-0018121
Aug. 23, 2010  (KR) .................. 10-2010-0081632

(51) Int. Cl.
*H01L 21/00* (2006.01)
(52) U.S. Cl.
USPC ............ 438/95; 136/264; 257/E31.003
(58) Field of Classification Search
USPC ............ 438/95; 136/264; 257/E31.003
See application file for complete search history.

(56) References Cited

U.S. PATENT DOCUMENTS

| | | | |
|---|---|---|---|
| 5,793,047 A * | 8/1998 | Kobayashi et al. | 250/370.09 |
| 2005/0028861 A1* | 2/2005 | Aoki et al. | 136/256 |
| 2005/0271827 A1* | 12/2005 | Krunks et al. | 427/446 |
| 2010/0329967 A1* | 12/2010 | Lu et al. | 423/508 |
| 2011/0081487 A1* | 4/2011 | Bollman et al. | 427/255.21 |

FOREIGN PATENT DOCUMENTS

| KR | 2006-0036190 A | 4/2006 |
|---|---|---|
| KR | 2009-0121660 A | 11/2009 |

OTHER PUBLICATIONS

Chris Eberspacher et al., "Thin-film CIS alloy PV materials fabricated using non-vacuum, particles-based techniques", Thin Solid Films, 387 (2001), pp. 18-22.
David B. Mitzi et al., "A High-Efficiency Solution-Deposited Thin-Film Photovoltaic Device", Advanced Materials, 20 (2008), pp. 3657-3662.

* cited by examiner

*Primary Examiner* — Phuc Dang
(74) *Attorney, Agent, or Firm* — Rabin & Berdo, P.C.

(57) ABSTRACT

Disclosed is a method of manufacturing a thin-film light-absorbing layer using spraying, including mixing precursor solutions comprising $CuCl_2$, $InCl_3$ and $SeC(NH_2)_2$ under a nitrogen atmosphere at room temperature thus preparing a mixture solution; spraying the mixture solution on a substrate and drying it, thus forming a thin film; and selenizing the thin film under a selenium atmosphere. A method of manufacturing a thin-film solar cell is also provided, which includes forming a back contact layer on a glass substrate using sputtering; forming a light-absorbing layer on the back contact layer using spraying; forming a buffer layer on the light-absorbing layer using chemical vapor deposition; forming a window layer on the buffer layer using sputtering; and forming an upper electrode layer on the window layer.

15 Claims, 7 Drawing Sheets

METHOD OF MANUFACTURING THIN-FILM LIGHT-ABSORBING LAYER, AND METHOD OF MANUFACTURING THIN-FILM SOLAR CELL USING THE SAME

CROSS REFERENCE TO RELATED APPLICATIONS

This application claims the benefit of Korean Patent Application Nos. 10-2010-0018121, filed Feb. 26, 2010 and 10-2010-0081632, filed Aug. 23, 2010, which are hereby incorporated by reference in their entirety into this application.

BACKGROUND OF THE INVENTION

1. Technical Field

The present invention relates to a method of manufacturing a thin-film light-absorbing layer and a method of manufacturing a thin-film solar cell using the same.

2. Description of the Related Art

Materials for use in thin-film solar cells include crystalline silicon, amorphous silicon, a dye sensitizer, CIS, CIGS, CdTe, etc. Among these materials, a CIS-based compound which shows the highest theoretical efficiency is useful in the fabrication of solar cells. Currently, a CIS-based thin-film light-absorbing layer is being manufactured using a high-vacuum apparatus via co-evaporation or sputtering. As is known to date, the light conversion efficiency is about 15% at its maximum in the case of a CIS-based thin-film light-absorbing layer, and is about 20% in the case of a CIGS-based thin-film light-absorbing layer.

Although deposition of a CIS-based thin-film light-absorbing layer manufactured in a high vacuum may result in a solar cell having high efficiency, it is expensive to manufacture the light-absorbing layer, it is difficult to make one with a large area, and an expensive apparatus is needed to produce a large-area solar cell. Moreover, methods of manufacturing a light-absorbing layer from four elements such as CIGS using co-evaporation or sputtering in a vacuum are disadvantageous because an apparatus typically used therefor is high-priced, and also because the light-absorbing layer is manufactured by controlling the composition of four elements or individual binary compounds, and thus the composition is difficult to control and the manufacturing cost may increase.

Hence, research into methods of manufacturing high-efficiency thin-film solar cells not in a vacuum but in a non-vacuum where it is easier to control the composition and process, compared to CIGS-based compound solar cells typically manufactured using co-evaporation or sputtering, is ongoing. That is, in the case of thin-film solar cells manufactured using co-evaporation or sputtering in a vacuum, they have remarkably lower price competitiveness compared to fossil-fuel power cost.

Korean patent application publication No. 10-2009-0121660A discloses a method of manufacturing a CIGS thin film and a light-absorbing layer of a solar cell manufactured using the same, in which a copper precursor, an indium precursor, a gallium precursor, and a selenium precursor are mixed with water or a buffer thus preparing a mixture solution, after which voltage is applied to a potentiostat so that a CIGS thin film is electrodeposited on a working electrode. Also, a method of manufacturing a CIGS thin film in a non-vacuum is disclosed, and a CIGS thin film is manufactured using prepared particles by means of spraying thus fabricating a cell having an efficiency of 11.7% (Chris Eberspacher Chris Fredric, Karen Pauls, Jack Serra, "Thin-film CIS alloy PV materials fabricated using non-vacuum, particles-based techniques", Thin Solid Films Vol 387, 18-22 (2001)). On the other hand, Korean patent application publication No. 10-2006-0036190A discloses a method of manufacturing an indium oxide sulfide buffer layer for a $Cu(In, Ga)Se_2$ or $Cu(In, Ga)(S, Se)_2$ thin-film solar cell using solution growth and a solar cell fabricated using the same, in which an indium oxyhydroxide sulfide thin film which is a new buffer material is formed to a thickness of tens of nm using an inexpensive solution growth process and a thin-film solar cell is fabricated using the same. The new buffer material used in the above patent may be grown using solution growth without post heat treatment to thus fabricate a solar cell. Also, a method of manufacturing a CIGS thin film using a CIGS solution precursor is disclosed, in which the CIGS thin film is formed from a solution precursor of CIGS using non-vacuum thin film deposition (David B. Mitzi, Min Yuan, Wei Liu, Andrew J. Kellock, S. Jay Chey, Vaughn Deline, Alex G. Schrott, "A High-Efficiency Solution-Deposited Thin-Film Photovoltaic Device" Adv. Mat., 2008, 9999, 1-6). As such, the solution precursor used may include a hydrazine solution and the CIGS thin film is formed using spin coating. In the case of a cell manufactured using a spin coated CIGS thin film, it may exhibit a light efficiency of about 12%. These methods are problematic because coating is not directly performed using the solution precursor in a non-vacuum or hydrazine which is highly toxic is used, undesirably causing environmental problems and reducing long-term stability.

Therefore, many attempts are being made to manufacture a CIS- or CIGS-based thin film in a non-vacuum in order to more easily and inexpensively fabricate a light-absorbing layer and a solar cell having a large area.

SUMMARY OF THE INVENTION

Accordingly, the present invention has been made keeping in mind the above problems encountered in the related art, and an object of the present invention is to provide a method of more simply and inexpensively manufacturing a thin-film light-absorbing layer using a low-temperature, low-cost and non-vacuum process, compared to conventional methods.

Another object of the present invention is to provide a method of manufacturing a thin-film solar cell using the method of manufacturing a thin-film light-absorbing layer.

In order to accomplish the above objects, the present invention provides a method of manufacturing a thin-film light-absorbing layer, comprising mixing precursor solutions comprising $CuCl_2$, $InCl_3$ and $SeC(NH_2)_2$ under a nitrogen atmosphere at room temperature, thus preparing a mixture solution; spraying the mixture solution on a substrate and drying the mixture solution, thus forming a thin film; and selenizing the thin film under a selenium atmosphere.

In addition, the present invention provides a thin-film light-absorbing layer, manufactured by mixing precursor solutions comprising $CuCl_2$, $InCl_3$ and $SeC(NH_2)_2$ under a nitrogen atmosphere at room temperature thus preparing a mixture solution, spraying the mixture solution on a substrate, drying the mixture solution, and then performing selenization under a selenium atmosphere.

In addition, the present invention provides a method of manufacturing a CIS-based thin-film solar cell, comprising forming a back contact layer on a glass substrate using sputtering; spraying on the back contact layer a mixture solution of $CuCl_2$, $InCl_3$ and $SeC(NH_2)_2$ precursor solutions mixed under conditions of a nitrogen atmosphere and room temperature, and performing selenization, thus forming a CIS-based light-absorbing layer; forming a buffer layer on the light-absorbing layer using chemical vapor deposition; forming a window layer on the buffer layer using sputtering; and forming an upper electrode layer on the window layer.

In addition, the present invention provides a method of manufacturing a CIGS-based thin-film solar cell, comprising forming a back contact layer on a glass substrate using sputtering; spraying on the back contact layer a mixture solution of $CuCl_2$, $InCl_3$, $GaCl_3$ and $SeC(NH_2)_2$ precursor solutions mixed under conditions of a nitrogen atmosphere and room temperature, and performing selenization, thus forming a CIGS-based light-absorbing layer; forming a buffer layer on the light-absorbing layer using chemical vapor deposition; forming a window layer on the buffer layer using sputtering; and forming an upper electrode layer on the window layer.

In addition, the present invention provides a thin-film solar cell, comprising a substrate; a back contact layer formed on the substrate using sputtering; a light-absorbing layer formed on the back contact layer by mixing precursor solutions comprising $CuCl_2$, $InCl_3$ and $SeC(NH_2)_2$ under a nitrogen atmosphere at room temperature thus preparing a mixture solution, spraying the mixture solution on the substrate, drying the mixture solution, and performing selenization under a selenium atmosphere; a buffer layer deposited on the light-absorbing layer using chemical bath deposition; a window layer formed on the buffer layer using sputtering; and an upper electrode layer formed on the window layer using sputtering.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
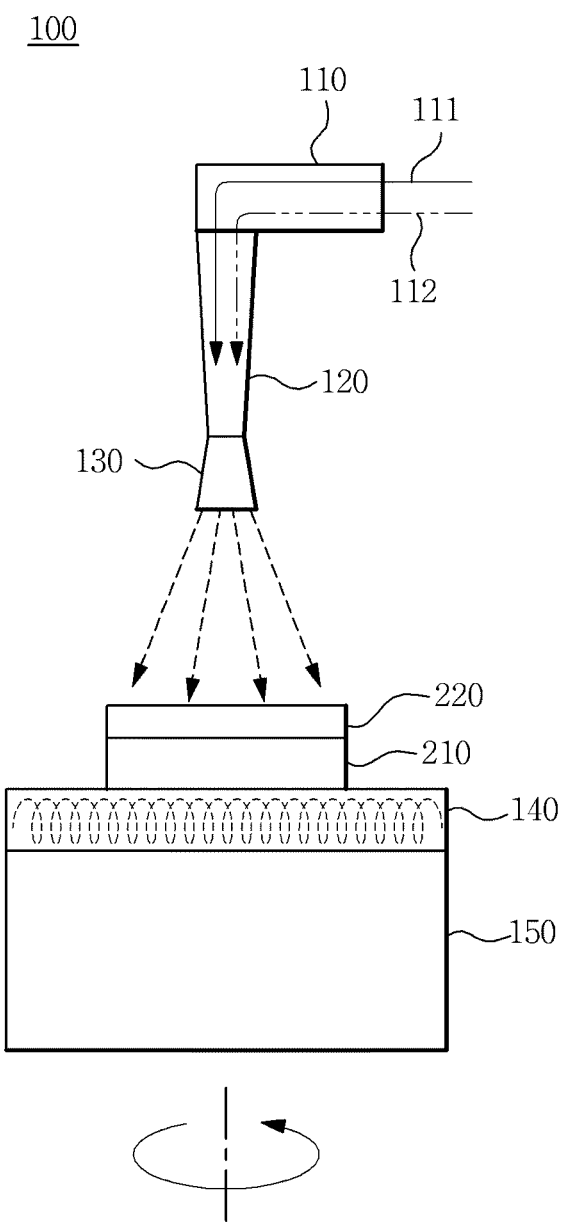
FIG. 1 is a schematic view showing an apparatus for manufacturing a thin-film light-absorbing layer according to the present invention.

The present invention pertains to a method of manufacturing a thin-film light-absorbing layer, including mixing $CuCl_2$, $InCl_3$ and $SeC(NH_2)_2$ precursor solutions under conditions of a nitrogen atmosphere and room temperature, thus preparing a mixture solution; spraying the mixture solution on a substrate and then drying it, thus forming a thin film; and selenizing the thin film under a selenium (Se) atmosphere.

Below, the steps of the method of manufacturing the thin-film light-absorbing layer according to the present invention are described in detail.

In the method of manufacturing the thin-film light-absorbing layer according to the present invention, preparing the mixture solution is performed by mixing $CuCl_2$, $InCl_3$ and $SeC(NH_2)_2$ precursor solutions under conditions of a nitrogen atmosphere and room temperature.

The mixture solution thus prepared is represented by $Cu_X In_Y Se_Z$ (X=0.5~1.4, Y=0.5~1.4, Z=1~6) by adjusting the solution composition of the precursor solutions. That is, the molar ratio of Cu, In and Se in the mixture solution is $Cu_X In_Y Se_Z$ (X=0.5~1.4, Y=0.5~1.4, Z=1~6). The precursor solution may further include $GaCl_3$. As such, the mixture solution may contain Ga of $GaCl_3$ which replaces some percentage (20%) of In.

In the method of manufacturing the thin-film light-absorbing layer according to the present invention, forming the thin film is performed by spraying the mixture solution on the substrate and then drying it.

Herein, spraying may be carried out in a non-vacuum. Also, heating the substrate at 300~500° C. for 30~60 min is preferable, but a substrate thermally treated at 300~500° C. for 30~60 min before spraying may be used. The substrate is heated by means of a heater provided in the apparatus for manufacturing a thin-film light-absorbing layer. As such, the apparatus further includes an inlet port into which the mixture solution is introduced, a spray nozzle for spraying the mixture solution, a spray gun disposed between the inlet port and the spray nozzle so that the mixture solution is transferred by a carrier gas, and a rotary shaker provided under the heater. Upon spraying, the carrier gas is nitrogen and is preferably sprayed at 3~50 ml/h, and the rotary shaker is rotated at 10~50 rpm. The thin film deposited using spraying may be dried by being cooled to room temperature at a rate of 8~12° C./min.

In the method of manufacturing the thin-film light-absorbing layer according to the present invention, selenizing is performed by allowing the thin film to stand at 450~610° C. for 30~120 min in a Se atmosphere.

In addition, the present invention pertains to a thin-film light-absorbing layer, manufactured by mixing $CuCl_2$, $InCl_3$ and $SeC(NH_2)_2$ precursor solutions under conditions of a nitrogen atmosphere and room temperature thus preparing a mixture solution, spraying the mixture solution on a substrate, drying it, and performing selenization in a Se atmosphere.

The mixture solution is composed of $CuCl_2$, $InCl_3$ and $SeC(NH_2)_2$ precursor solutions, and may further include a $GaCl_3$ precursor solution.

In addition, the present invention pertains to a method of manufacturing a CIS-based thin-film solar cell, including forming a back contact layer on a glass substrate using sputtering; spraying on the back contact layer a mixture solution of $CuCl_2$, $InCl_3$ and $SeC(NH_2)_2$ precursor solutions mixed under conditions of a nitrogen atmosphere and room temperature, and performing selenization, thus forming a CIS-based light-absorbing layer; forming a buffer layer on the light-absorbing layer using chemical vapor deposition; forming a window layer on the buffer layer using sputtering; and forming an upper electrode layer on the window layer.

Specifically, spraying is performed using an apparatus for manufacturing a thin-film light-absorbing layer comprising an inlet port into which the mixture solution is introduced, a spray nozzle for spraying the mixture solution, a spray gun disposed between the inlet port and the spray nozzle so that the mixture solution is transferred by a carrier gas, a heater for heating the substrate, and a rotary shaker provided under the heater.

In addition, the present invention pertains to a thin-film solar cell comprising a substrate 210; a back contact layer 220 formed on the substrate 210 using sputtering; a light-absorbing layer 230 formed on the back contact layer 220 by mixing $CuCl_2$, $InCl_3$ and $SeC(NH_2)_2$ precursor solutions under conditions of a nitrogen atmosphere and room temperature thus preparing a mixture solution, spraying the mixture solution on the substrate, drying it, and performing selenization in a Se atmosphere; a buffer layer 240 deposited on the light-absorbing layer 230 using chemical bath deposition; a window layer 250 formed on the buffer layer 240 using sputtering; and an upper electrode layer 270 formed on the window layer 250 using sputtering.

The above purposes, features and advantages will become more apparent by means of the following description with reference to the appended drawings. In the description of the present invention, descriptions of known techniques are regarded as unnecessary and may be omitted when they would make the characteristics of the invention unclear.

Also, saying that any part "includes" any element means that another element is not excluded but is further included unless otherwise stated.

FIG. 1 is a schematic view showing the apparatus for manufacturing a thin-film light-absorbing layer according to the present invention.

The apparatus 100 for manufacturing a thin-film light-absorbing layer as shown in FIG. 1 includes the inlet port 110 into which the mixture solution 111 is introduced, the spray nozzle 130 for spraying the mixture solution 111, the spray gun 120 disposed between the inlet port 110 and the spray nozzle 130 so that the mixture solution 111 is transferred by the carrier gas 112, the heater 140 spaced apart from the spray nozzle 130 and provided at the lower portion of the apparatus so that the substrate 210 is heated, and the rotary shaker 150 provided under the heater 140, and is used to spray the mixture solution in a non-vacuum.

The mixture solution 111 is obtained by mixing $CuCl_2$, $InCl_3$ and $SeC(NH_2)_2$ precursor solutions in a nitrogen atmosphere so that as little contaminant as possible is added, and mixing is preferably carried out at room temperature for about 5 min so that the reaction of precursor solutions efficiently takes place. As such, the solution composition of precursor solutions is appropriately adjusted thus preparing the mixture solution 111 represented by $Cu_xIn_ySe_z$ (X=0.5~1.4, Y=0.5~1.4, Z=1~6). Also, the precursor solutions further includes $GaCl_3$ and thus the mixture solution may contain Ga of $GaCl_3$ which replaces some percentage (20%) of In.

The method of manufacturing the thin-film light-absorbing layer using the apparatus 100 for manufacturing a thin-film light-absorbing layer is specifically described herein. The molybdenum (Mo) back contact layer 220 deposited on the glass substrate 210 is maintained at 300~500° C. using the heater 140, after which nitrogen gas serving as the carrier gas 112 is controlled so as to be uniformly sprayed at 3~50 ml/h in order to prevent the mixture solution 111 from becoming contaminated, and the substrate 210 having the Mo back contact layer 220 is rotated at 10~50 rpm by means of the rotary shaker 150 so that the mixture solution 111 is uniformly sprayed on the Mo back contact layer 220. As such, the substrate 210 having the Mo back contact layer 220 may be heated at 300~500° C. for 30~60 min, or may be heated before spraying. This heating process plays a role in enhancing the adhesion of the Mo back contact layer 220 to the glass substrate 210, and thus problems in which the Mo thin film is separated during a subsequent process such as spraying do not occur. The thin-film light-absorbing layer deposited using spraying may be dried by being slowly cooled to room temperature at a rate of 8~12° C./min.

In order to make the thin-film light-absorbing layer be dense and crystalline, selenization is preferably performed at 450~610° C. for 30~120 min. As such, the Se vapor used includes Se particles thus forming a selenization atmosphere.

The above is a description of the method of manufacturing the thin-film light-absorbing layer using spraying. Below, a CIS-based solar cell and a CIGS-based thin-film solar cell including the thin-film light-absorbing layer thus manufactured are described.

Figure 2:
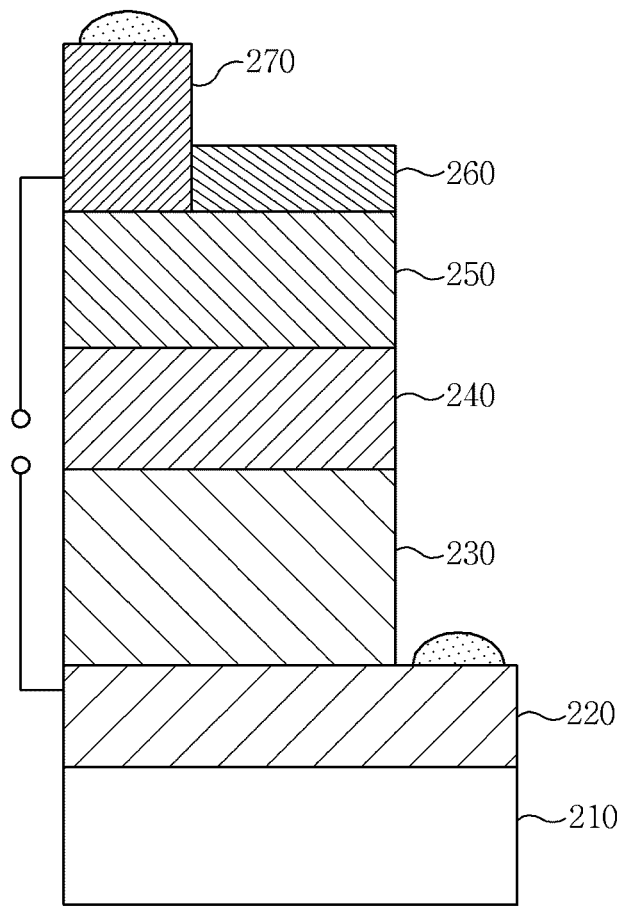
FIG. 2 is a schematic view showing a thin-film solar cell according to the present invention.

FIG. 2 schematically shows the thin-film solar cell according to the present invention.

With reference to FIG. 2, the thin-film solar cell according to the present invention includes the back contact layer 220, the CIS- or CIGS-based light-absorbing layer 230, the buffer layer 240, the window layer 250, and the upper electrode layer 270, which are sequentially formed on the substrate 210.

The substrate 210 is a glass substrate, preferably a soda-lime glass substrate. In addition thereto, a substrate made of the same or similar material may be used.

The back contact layer 220 is formed on the substrate 210, and the material of the back contact layer is not particularly limited but typically includes Mo. The back contact layer is formed at a thickness of about 1 μm on the substrate using sputtering.

The CIS- or CIGS-based light-absorbing layer 230 is formed on the back contact layer 220. The CIS- or CIGS-based light-absorbing layer is specified with reference to FIG. 1, and its specific description is omitted.

The buffer layer 240 is formed on the light-absorbing layer 230 by depositing cadmium sulfide (CdS) typically useful as a material of a light-absorbing layer using chemical bath deposition.

The window layer 250 functioning as a transparent electrode is formed on the buffer layer 240 by sequentially depositing i-ZnO and n-ZnO using sputtering. An optional antireflective layer 260 may be further formed on the window layer 250.

The upper electrode layer 270 is formed on the window layer 250 by depositing aluminum (Al) to a thickness of about 1 μm using sputtering.

Figure 3:
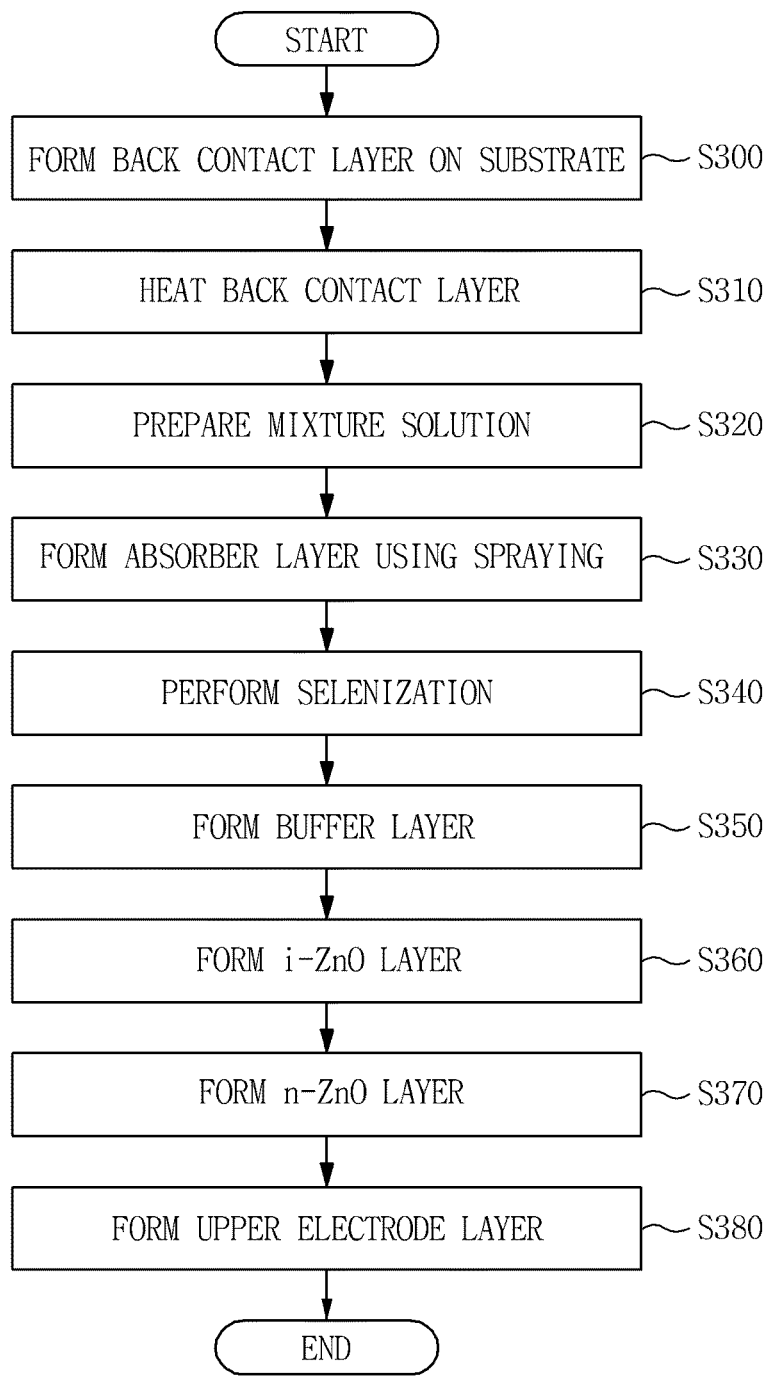
FIG. 3 is a flowchart showing a process of manufacturing the thin-film solar cell according to the present invention.

FIG. 3 is a flowchart showing the process of manufacturing the thin-film solar cell according to the present invention.

With reference to FIG. 3, the CIS- or CIGS-based thin-film solar cell may be manufactured by forming the back contact layer on the substrate using sputtering (S300), heating the back contact layer (S310), mixing $CuCl_2$, $InCl_3$ and $SeC(NH_2)_2$ or $CuCl_2$, $InCl_3$, $GaCl_3$ and $SeC(NH_2)_2$ precursor solutions under conditions of a nitrogen atmosphere and room temperature thus preparing the mixture solution (S320), spraying the mixture solution on the back contact layer (S330), drying it, performing selenization (S340), thus forming a CIS- or CIGS-based light-absorbing layer, forming the buffer layer on the light-absorbing layer using chemical bath deposition (S350), forming the window layer on the buffer layer using sputtering (S360 and S370), and forming the upper electrode layer on the window layer using sputtering (S380).

Example 1

Formation of CIS-Based Thin-Film Light-Absorbing Layer

Preparation of Mixture Solution $CuCl_2$, $InCl_3$ and $SeC(NH_2)_2$ precursor solutions were blended in a nitrogen atmosphere so that as little contaminant as possible was added and then mixed at room temperature for about 5 min so that the reaction of respective reactants efficiently occurred, thus preparing a mixture solution represented by $Cu_XIn_YSe_Z$ (X=0.5~1.4, Y=0.5~1.4, Z=1~6).

Formation of Thin Film

Nitrogen gas was controlled so as to be uniformly sprayed at 3~50 ml/h on a Mo back contact layer heated at 300~500° C. for 30~60 min, and the substrate located under the Mo back contact layer was rotated at 10~50 rpm, whereby the mixture solution was sprayed thereon, and the thin film thus formed was dried by being slowly cooled to room temperature at a rate of 8~12° C./min, thus manufacturing a thin film 1 μm thick.

Selenization

The thin film was selenized in a Se atmosphere at 450~610° C. for 30~120 min, thus manufacturing a CIS-based thin-film light-absorbing layer.

Example 2

Formation of CIGS-Based Thin-Film Light-Absorbing Layer

A thin-film light-absorbing layer was manufactured in the same manner as in Example 1, with the exception that $GaCl_3$ was further added to the mixture solution so that the mixture solution contained Ga which replaces some percentage (20%) of In.

Example 3

Fabrication of CIS-Based Thin-Film Solar Cell

Formation of Back Contact Layer

Mo was deposited to a thickness of 1 μm on a glass substrate or a sodalime glass substrate using sputtering, thus forming a Mo back contact layer.

Formation of CIS-Based Light-Absorbing Layer

The CIS-based thin-film light-absorbing layer was formed to a thickness of 1 μm using the procedures of Example 1.

Formation of Buffer Layer

A CdS buffer layer was formed on the light-absorbing layer using chemical vapor deposition.

Formation of Window Layer

On the buffer layer, i-ZnO and n-ZnO were sequentially deposited using sputtering, thus forming a window layer.

Formation of Upper Electrode Layer

An Al upper electrode layer was formed to a thickness of 1 μm on the window layer using sputtering, thereby manufacturing a CIS-based thin-film solar cell.

Example 4

Fabrication of CIGS-Based Thin-Film Solar Cell

A CIGS-based thin-film solar cell was manufactured in the same manner as in Example 3, with the exception that the CIGS-based thin-film light-absorbing layer was formed using the procedures of Example 2.

Test Example 1

Analysis of Surface of Thin-Film Light-Absorbing Layer

The surface of the thin film manufactured by the process of manufacturing a thin-film light-absorbing layer according to the present invention was analyzed using an SEM. The results are shown in FIGS. 4 and 5.

Figure 4:
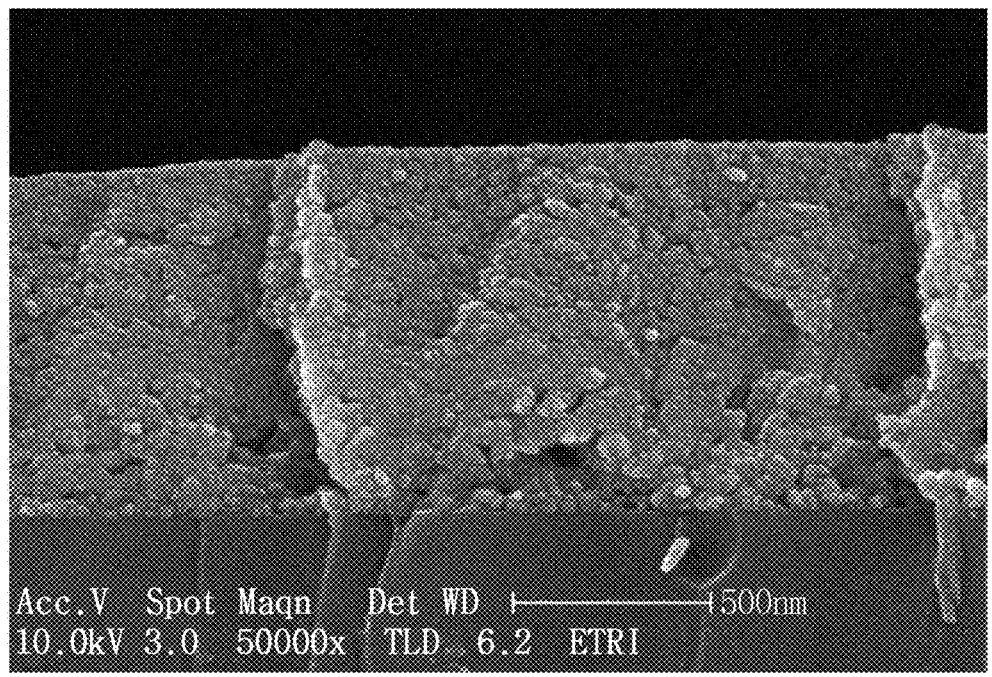
FIG. 4 is a scanning electron microscope (SEM) image showing the surface of a thin film manufactured using only spraying in the manufacturing process according to the present invention.

With reference to FIG. 4, the thin film manufactured using spraying in a non-vacuum is uniformly deposited to a predetermined thickness, and exhibits p-type semiconductor properties depending on the solution composition.

Figure 5:
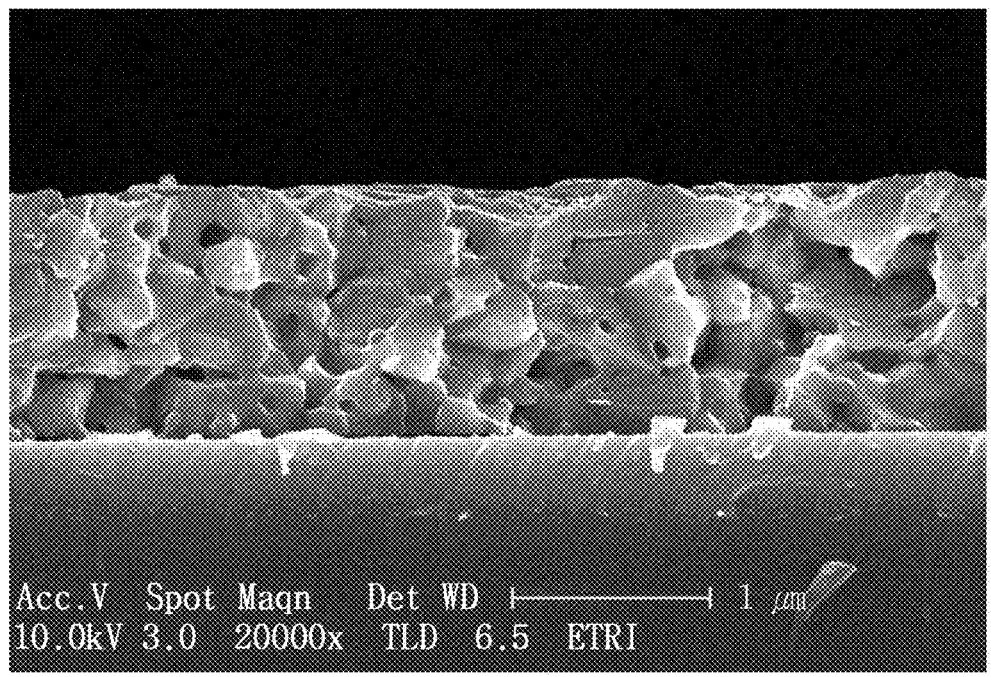
FIG. 5 is an SEM image showing the surface of a thin film manufactured using the manufacturing process according to the present invention.

With reference to FIG. 5, the thin film of Example 1 is densely crystallized thanks to selenization under conditions of a Se atmosphere, 450~610° C. and 30~120 min.

Test Example 2

Analysis of Transmittance of Thin-Film Light-Absorbing Layer

The transmittance of the CIS-based thin-film light-absorbing layer manufactured using the method according to the present invention was measured. The results are shown in FIG. 6.

Figure 6:
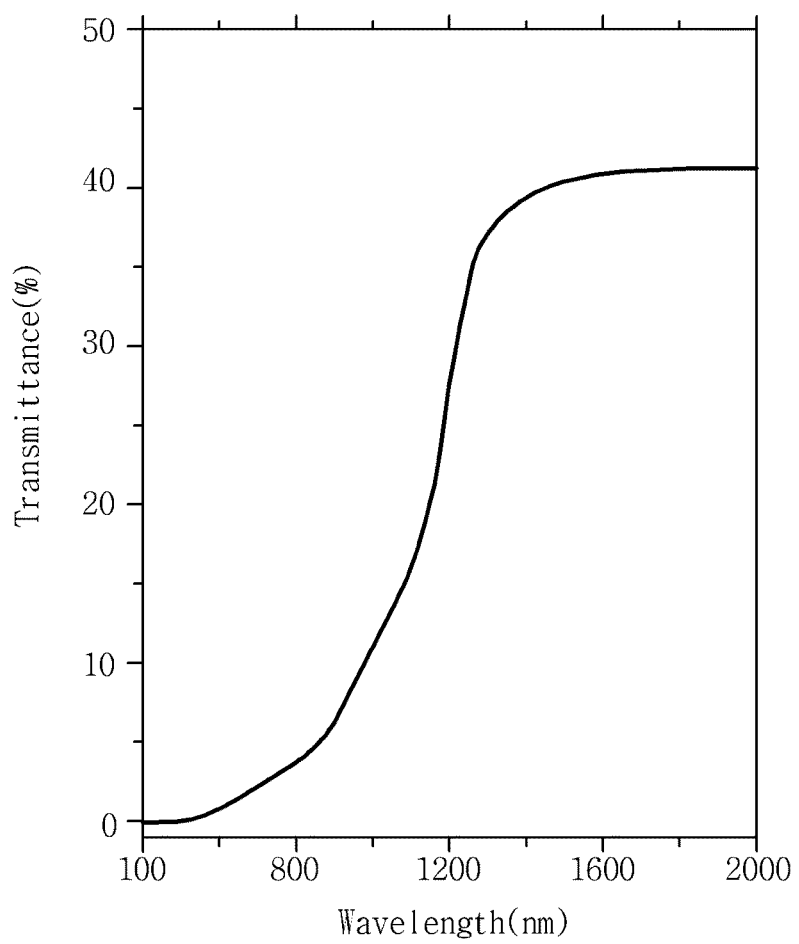
FIG. 6 is a graph showing the transmittance of the CIS-based thin film manufactured using the manufacturing process according to the present invention.

With reference to FIG. 6, the energy gap of the thin film of Example 1 is about 1.01 eV, which is almost the same as a theoretical value. The energy gap may be changed by adjusting the ratio of X, Y and Z of $Cu_XIn_YSe_Z$ in the mixture solution precursor. Furthermore, the transmittance at a wavelength ranging from 400 nm to about 1000 nm is obtained because the thin film is slightly thin. When the thin film is deposited to a thickness of 1 μm or more, it can completely absorb light and is thus very efficient.

Test Example 3

Analysis of Solar Light Conversion Efficiency of CIS-Based Thin-Film Solar Cell

The solar light conversion efficiency of the CIS-based thin-film solar cell according to the present invention was measured. The results are shown in FIG. 7.

Figure 7:
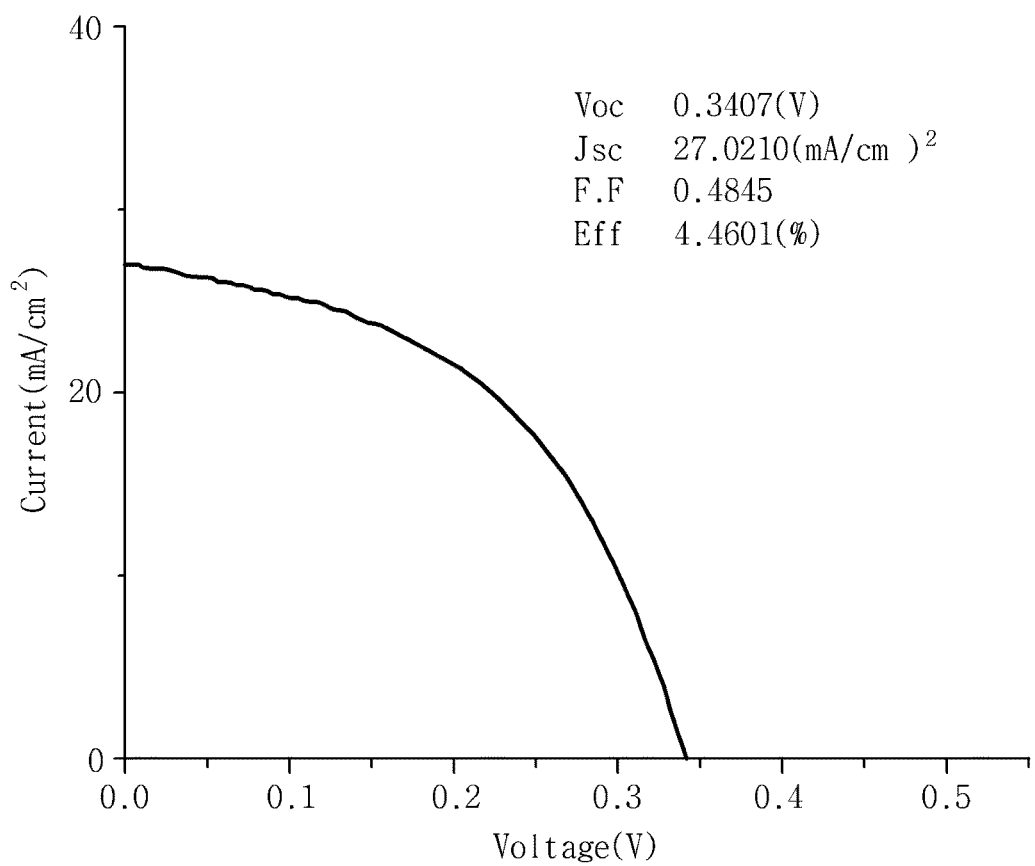
FIG. 7 is a graph showing the solar light conversion efficiency of the CIS-based solar cell including the thin film manufactured using the manufacturing process according to the present invention.

With reference to FIG. 7, the CIS-based thin-film solar cell of Example 3 exhibits the solar light conversion efficiency equal to that of a thin-film solar cell including a light-absorbing layer resulting from a solution process.

As described above, the present invention provides a method of manufacturing a thin-film light-absorbing layer and a method of manufacturing a thin-film solar cell. According to the present invention, a CIS- or CIGS-based light-absorbing layer can be manufactured using a low-temperature, low-cost and non-vacuum process, thus making it possible to more simply and inexpensively manufacture it, compared to conventional methods. A large area light-absorbing layer can be manufactured on a large scale.

Also, according to the present invention, an organic solvent such as an amine which undesirably causes environmental contamination is not used, thus reducing harm to the environment. Compared to a light-absorbing layer manufactured in a high vacuum, the light-absorbing layer according to the present invention enables a solar cell that has been used to easily be collected and disposed of, and thus can be usefully applied to fabricate a thin-film solar cell.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a thin-film light-absorbing layer on a substrate, comprising:

preparing a mixture solution by mixing precursor solutions comprising $CuCl_2$, $InCl_3$ and $SeC(NH_2)_2$ under a nitrogen atmosphere at room temperature;

preparing a substrate;

spraying the mixture solution comprising Cu, In and Se on the substrate and drying the mixture solution, thus forming a light-absorbing thin film; and selenizing the light-absorbing thin film under a selenium atmosphere.

2. The method of claim 1, wherein the preparing the mixture solution comprises adjusting a solution composition of the precursor solutions thus preparing a mixture solution represented by $Cu_xIn_ySe_z$ (X=0.5~1.4, Y=0.5~1.4, Z=1~6).

3. The method of claim 1, wherein the precursor solutions further comprises $GaCl_3$.

4. The method of claim 3, wherein the mixture solution contains Ga of the $GaCl_3$, the Ga replacing some of In of the $InCl_3$ in the mixture solution.

5. The method of claim 1, wherein the spraying is performed in a non-vacuum.

6. The method of claim 1, wherein the substrate is heated at 300~500° C. for 30~60 min.

7. The method of claim 6, wherein the substrate is heated using a heater provided in an apparatus for manufacturing a thin-film light-absorbing layer.

8. The method of claim 7, wherein the apparatus for manufacturing a thin-film light-absorbing layer comprises an inlet port into which the mixture solution is introduced, a spray nozzle for spraying the mixture solution, a spray gun provided between the inlet port and the spray nozzle so that the mixture solution is transferred by a carrier gas, and a rotary shaker provided under the heater.

9. The method of claim 8, wherein the carrier gas is nitrogen, and is sprayed at 3~50 ml/h.

10. The method of claim 8, wherein the rotary shaker is rotated at 10~50 rpm.

11. The method of claim 1, wherein the drying comprises cooling to room temperature at a rate of 8~12° C./min.

12. The method of claim 1, wherein the selenizing is performed at 450~610° C. for 30~120 min.

13. A method of manufacturing a CIS-based thin-film solar cell, comprising:

forming a back contact layer on a glass substrate using sputtering;

spraying on the back contact layer a mixture solution comprising $CuCl_2$, $InCl_3$ and $SeC(NH_2)_2$ precursor solutions mixed under a nitrogen atmosphere at room temperature, and performing selenization, thus forming a CIS-based light-absorbing layer;

forming a buffer layer on the light-absorbing layer using chemical vapor deposition;

forming a window layer on the buffer layer using sputtering; and forming an upper electrode layer on the window layer.

14. The method of claim 13, wherein the spraying is performed using an apparatus for manufacturing a thin-film light-absorbing layer comprising an inlet port into which the mixture solution is introduced, a spray nozzle for spraying the mixture solution, a spray gun provided between the inlet port and the spray nozzle so that the mixture solution is transferred by a carrier gas, a heater for heating the substrate, and a rotary shaker provided under the heater.

15. A method of manufacturing a CIGS-based thin-film solar cell, comprising:

forming a back contact layer on a glass substrate using sputtering;

spraying on the back contact layer a mixture solution comprising $CuCl_2$, $InCl_3$, $GaCl_3$ and $SeC(NH_2)_2$ precursor solutions mixed under a nitrogen atmosphere at room temperature, and performing selenization, thus forming a CIGS-based light-absorbing layer;

forming a buffer layer on the light-absorbing layer using chemical vapor deposition;

forming a window layer on the buffer layer using sputtering; and forming an upper electrode layer on the window layer.

* * * * *